United States Patent
Li et al.

(10) Patent No.: US 6,465,157 B1
(45) Date of Patent: Oct. 15, 2002

(54) DUAL LAYER PATTERN FORMATION METHOD FOR DUAL DAMASCENE INTERCONNECT

(75) Inventors: Jianxun Li, Orlando, FL (US); Mei Sheng Zhou; Subhash Gupta, both of Singapore (SG); Ming hui Far, Orlando, FL (US)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 09/494,638

(22) Filed: Jan. 31, 2000

(51) Int. Cl.⁷ .................................................. G03F 7/00
(52) U.S. Cl. ...................... 430/313; 430/311; 430/312; 430/394
(58) Field of Search ................................ 430/311, 312, 430/313, 316, 394

(56) References Cited

U.S. PATENT DOCUMENTS

| | | | | |
|---|---|---|---|---|
| 3,518,084 A | * | 6/1970 | Barson et al. .............. | 430/312 |
| 5,616,517 A | * | 4/1997 | Wen et al. .................. | 437/125 |
| 5,635,423 A | | 6/1997 | Huang et al. .............. | 437/195 |
| 5,741,626 A | | 4/1998 | Jain et al. .................. | 430/314 |
| 5,821,169 A | | 10/1998 | Nguyen et al. ............. | 438/736 |
| 5,877,075 A | | 3/1999 | Dai et al. .................... | 438/597 |
| 5,877,076 A | | 3/1999 | Dai ............................. | 438/597 |
| 5,882,996 A | | 3/1999 | Dai ............................. | 438/597 |
| 5,922,517 A | * | 7/1999 | Bhatt et al. ................. | 430/315 |
| 5,930,890 A | * | 8/1999 | Chou et al. ................. | 293/852 |
| 5,989,783 A | * | 11/1999 | Huggins et al. ............ | 430/316 |
| 6,042,975 A | * | 3/2000 | Burm et al. ................. | 430/22 |
| 6,110,648 A | * | 8/2000 | Jang ........................... | 430/312 |
| 6,139,995 A | * | 10/2000 | Burm et al. ................. | 430/22 |
| 6,197,481 B1 | * | 3/2001 | Chang et al. ............... | 430/314 |

* cited by examiner

*Primary Examiner*—Janet Baxter
*Assistant Examiner*—Amanda C. Walke
(74) *Attorney, Agent, or Firm*—George O. Saile; Rosemary L.S. Pike

(57) ABSTRACT

A new method of forming dual damascene interconnects has been achieved. A semiconductor substrate is provided. A dielectric layer is provided overlying the semiconductor substrate. A first photoresist layer is deposited overlying the dielectric layer. The first photoresist layer is exposed, but not developed, to define patterns where via trenches are planned. A second photoresist layer is deposited overlying the first photoresist layer. The second photoresist layer is exposed to define patterns where interconnect trenches are planned. The second photoresist layer and the first photoresist layer are developed to complete the via trench pattern of the first photoresist layer and the interconnect trench pattern of the second photoresist layer. The dielectric layer is etched through where defined by the via trench pattern of the first photoresist layer. The dielectric layer is etch where defined by the interconnect pattern of the second photoresist layer, and the dual damascene interconnect of the integrated circuit device is completed.

18 Claims, 11 Drawing Sheets

DUAL LAYER PATTERN FORMATION METHOD FOR DUAL DAMASCENE INTERCONNECT

BACKGROUND OF THE INVENTION (1) Field of the Invention

The invention relates to a method of fabricating semiconductor structures, and more particularly, to a method of forming dual damascene interconnect structures in the manufacture of integrated circuit devices.

(2) Description of the Prior Art

Damascene interconnects are used in the art as an alternative to metal etched contacts. The key to damascene technology is the definition of via and trace trenches in the dielectric material. Once the trenches are defined, the metal material is deposited to fill the trenches. A polishing down process is performed to remove excess metal and complete the definition of the damascene interconnects.

FIG. 1 illustrates an integrated circuit device of the prior art. A semiconductor substrate 10 is shown. An insulating layer 14 is formed overlying the semiconductor substrate 10. Metal traces 18 are shown formed in the insulating layer 14. The metal traces 18 comprise a lower level of interconnection. A cap layer 22 overlies the metal traces 18. A first dielectric layer 26 overlies the cap layer 22. An etch stop layer 30 overlies the first dielectric layer 26. A second dielectric layer 34 overlies the etch stop layer 30.

A dual damascene interconnect will be formed in this integrated circuit device. In a dual damascene structure, trenches are etched into the dielectric material to form a via to the underlying interconnect level and to form another interconnect level. A first photoresist layer 38 is deposited overlying the second dielectric layer 34. The first photoresist layer 38 is patterned by a typical photolithographic technique to form openings where the via trenches will be formed. In this photolithographic technique, the first photoresist layer 38 is exposed to light through a mask and then is developed to remove parts of the photoresist material. The openings formed overlie at least a part of the metal traces 18 as shown.

Referring now to FIG. 2, the via trenches are etched through the second dielectric layer 34, the etch stop layer 30 and the first dielectric layer 26. The first photoresist layer 38 is used as a mask for the etch. Following the via trench etch, the first photoresist layer 38 is stripped away.

Referring now to FIG. 3, a second photoresist layer 42 is deposited overlying the second dielectric layer 34 and filling the via trench. The second photoresist layer 42 is then patterned by a typical photolithographic technique to form openings where the upper interconnect trenches will be formed. In this photolithographic technique, the second photoresist layer 42 is exposed to light through a mask and then is developed to remove parts of the photoresist material. The openings formed overlie at least a part of the via trench openings.

The upper interconnect trenches are then etched through the second dielectric layer 34 stopping at the etch stop layer 30. After the upper interconnect trenches are etched, the second photoresist layer 42 is stripped away.

Referring now to FIG. 4, the cap layer 22 is etched through to expose the metal traces 18. A metal layer 46 is deposited overlying the second dielectric layer 34 and filling the trenches. Finally, a chemical mechanical polish is performed to remove the excess metal layer 46 overlying the second dielectric layer 34 so that the metal is confined to the trenches. This completes the dual damascene structure.

Note that two complete photolithographic sequences are required to form the trenches for the dual damascene structure. In each sequence, photoresist is applied, exposed, developed, used as a mask for an etching operation, and then stripped away. If a process sequence could be devised to eliminate a step of application, exposure, developing, or stripping, then significant cost savings may result.

Several prior art approaches disclose methods to form photoresist patterns in the fabrication of dual damascene structures. U.S. Pat. No. 5,821,169 to Nguyen et al discloses a process to make dual damascene structures where a multilevel photoresist pattern is used with a hard mask layer to create multiple levels in the dielectric. U.S. Pat. No. 5,877,076 to Dai teaches a process to form a dual damascene structure where chemical amplification resist (CAR) photoresist is used. Negative and positive photoresist layers are used. The dual damascene pattern is formed in the photoresist layers and then transferred to the dielectric layers underlying by an etching process. U.S. Pat. No. 5,882,996 to Dai discloses a dual damascene process where an anti-reflective coating is used between two chemical amplification resist (CAR) layers. The dual damascene pattern is formed in the photoresist stack and transferred to the dielectric layers underlying by etching. U.S. Pat. No. 5,635,423 to Huang et al discloses a process to create dual damascene structures using two photoresist layers, exposures, develops, and strips. U.S. Pat. No. 5,741,626 to Jain et al teaches a dual damascene process where anti-reflective coating layers of $Ta_3N_5$ are used between dielectrics. U.S. Pat. No. 5,877,075 to Dai et al teaches a dual damascene process using only one photoresist to form the pattern. A CAR photoresist is used. A silylation process is used to create a temporary hard mask in a portion of the photoresist.

SUMMARY OF THE INVENTION

A principal object of the present invention is to provide an effective and very manufacturable method of fabricating dual damascene interconnects in the manufacture of integrated circuits.

A further object of the present invention is to provide a method to fabricate dual damascene interconnects where two photoresist patterns, used to mask the trench etches, are formed using a single develop step.

Another further object of the present invention is to provide a method to fabricate dual damascene interconnects where two photoresist patterns are formed prior to etching either trench.

In accordance with the objects of this invention, a new method of forming dual damascene interconnects has been achieved. A semiconductor substrate is provided. A dielectric layer is provided overlying the semiconductor substrate. A first photoresist layer is deposited overlying the dielectric layer. The first photoresist layer is exposed, but not developed, to define patterns where via trenches are planned. A second photoresist layer is deposited overlying the first photoresist layer. The second photoresist layer is exposed to define patterns where interconnect trenches are planned. The second photoresist layer and the first photoresist layer are developed to complete the via trench pattern of the first photoresist layer and the interconnect trench pattern of the second photoresist layer. The dielectric layer is etched through where defined by the via trench pattern of the first photoresist layer. The dielectric layer is etched where defined by the interconnect pattern of the second photoresist layer, and the dual damascene interconnect of the integrated circuit device is completed.

Also in accordance with the objects of this invention, a new method of forming dual damascene interconnects has been achieved. A semiconductor substrate is provided. A dielectric layer is provided overlying the semiconductor substrate. A first photoresist layer is deposited overlying the dielectric layer. The first photoresist layer is exposed and developed to define patterns where via trenches are planned. A second photoresist layer is deposited overlying the first photoresist layer and filling the openings in the via trench pattern. The second photoresist layer is exposed and developed to define patterns where interconnect trenches are planned. The dielectric layer is etched through where defined by the via trench pattern of the first photoresist layer. The dielectric layer is etched where defined by the interconnect pattern of the second photoresist layer, and the dual damascene interconnect of the integrated circuit device is completed.

Also in accordance with the objects of this invention, a new method of forming dual damascene interconnects has been achieved. A semiconductor substrate is provided. A dielectric layer is provided overlying the semiconductor substrate. A first photoresist layer is deposited overlying the dielectric layer. The first photoresist layer is exposed, but not developed, to define patterns where via trenches are planned. A buffer layer is deposited overlying the first photoresist layer. A second photoresist layer is deposited overlying the buffer layer. The second photoresist layer is exposed to define patterns where interconnect trenches are planned. The second photoresist layer and the first photoresist layer are developed and the buffer layer is stripped to complete the via trench pattern of the first photoresist layer and the interconnect trench pattern of the second photoresist layer and the buffer layer. The dielectric layer is etched through where defined by the via trench pattern of the first photoresist layer. The dielectric layer is etched where defined by the interconnect pattern of the second photoresist layer and the buffer layer, and the dual damascene interconnect of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

These embodiments disclose the application of the present invention to the formation of dual damascene interconnect structures. It should be clear to those experienced in the art that the present invention can be applied and extended without deviating from the scope of the present invention.

Figure 1:
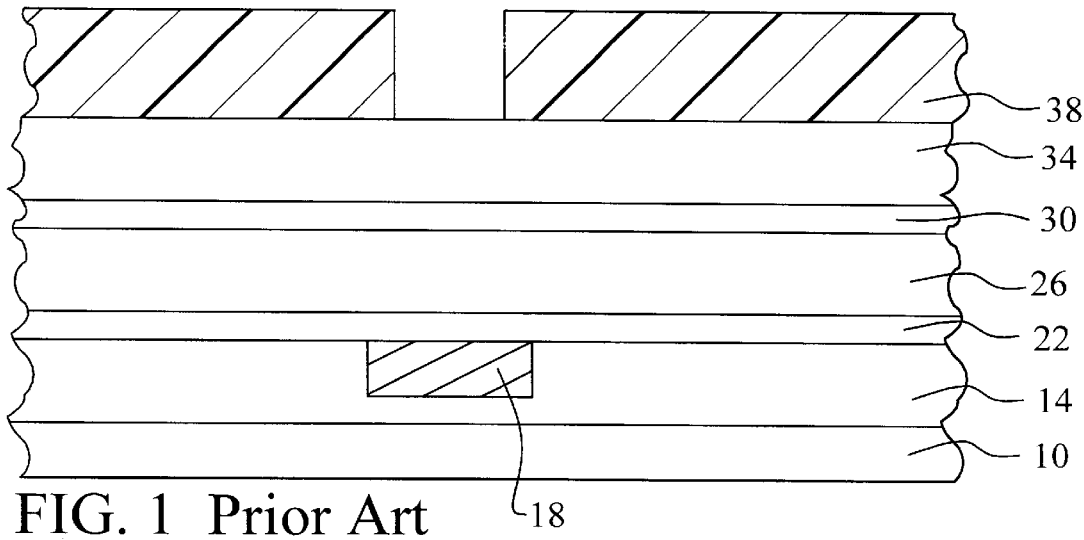
FIGS. 1 through 4 schematically illustrate in cross-section a partially completed prior art integrated circuit device.
Figure 2:
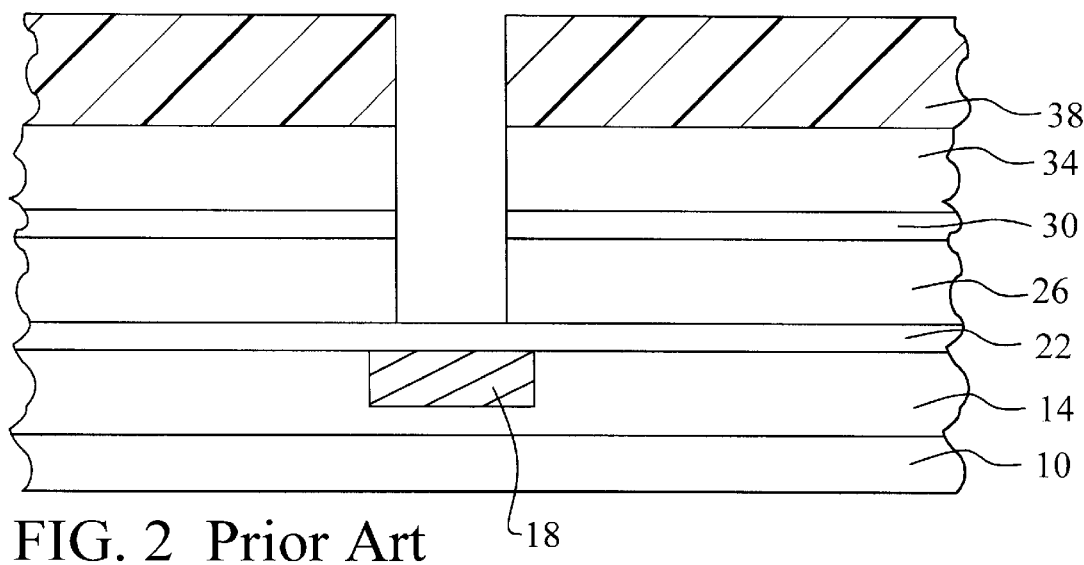
Figure 3:
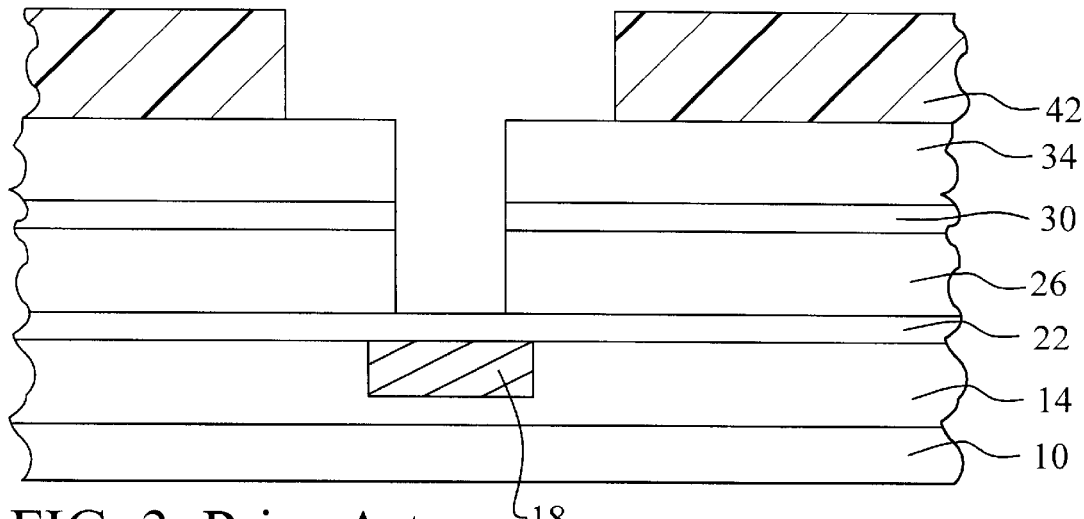
Figure 4:
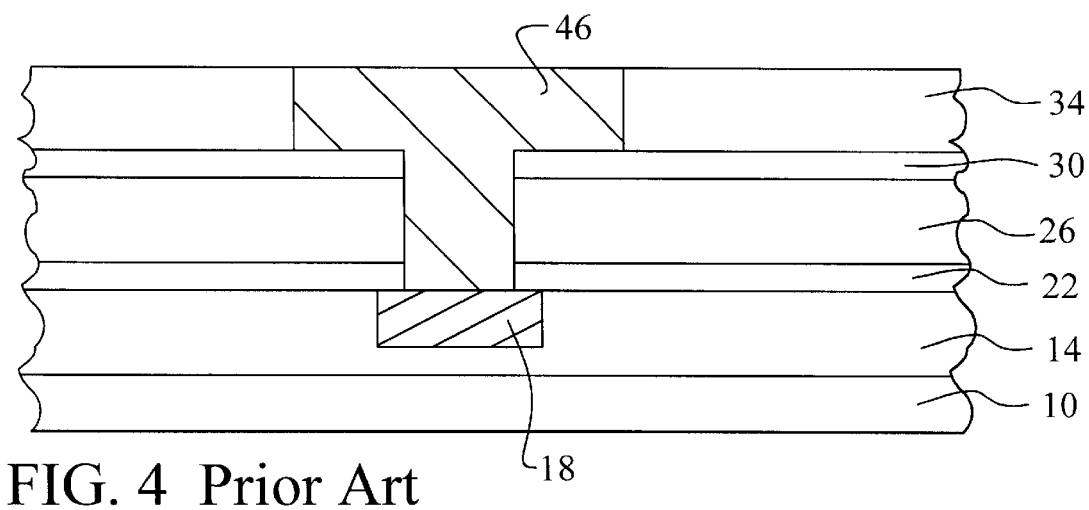
Figure 5:
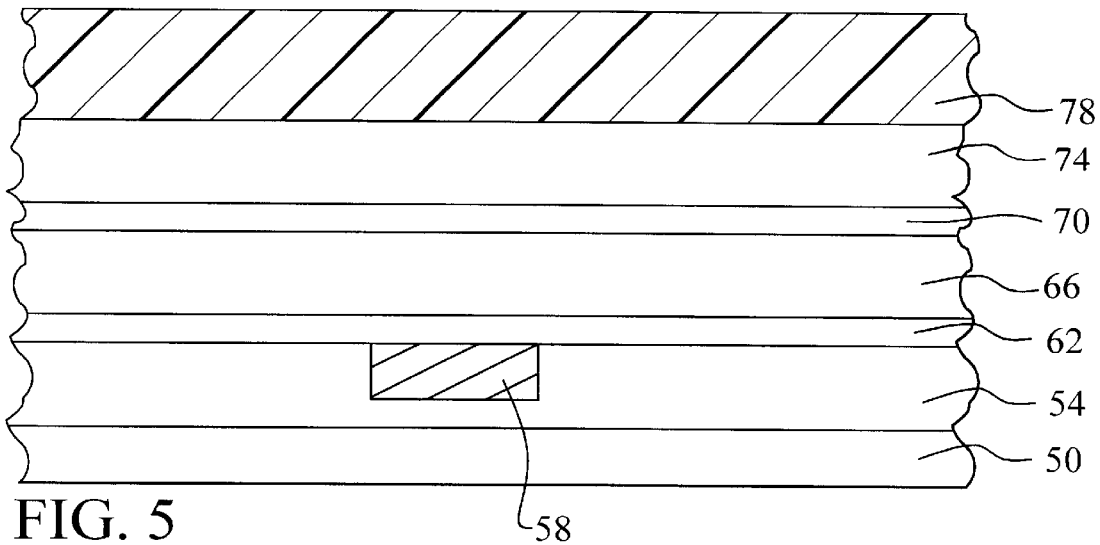
FIGS. 5 through 9 schematically illustrate in cross-sectional representation a first preferred embodiment of the present invention.

Referring now particularly to FIG. 5, there is shown a cross section of a partially completed integrated circuit device of the first preferred embodiment. A semiconductor substrate 50, typically consisting of monocrystalline silicon, is provided. An insulating layer 54 is provided overlying the semiconductor substrate 50. The insulating layer 54 is typically composed of silicon dioxide. Metal conductors 58 are formed in the insulating layer 54 as is conventional in the art. The metal conductors 58 comprise either aluminum or copper and may be formed using, for example, a damascene approach.

A cap layer 62 is deposited overlying the insulating layer 54 and the metal conductors 58. The cap layer 62 comprises a material that will act as a barrier layer for the metal conductors 58. If copper is used in the metal conductors 58 a barrier material is needed to keep copper from diffusing into the dielectric materials used as isolation. In this embodiment, the cap layer 62 comprises, for example, silicon nitride deposited to a thickness of between about 150 Angstroms and 1,500 Angstroms.

A first dielectric layer 66 is deposited overlying the cap layer 62. The first dielectric layer 66 will isolate the metal via. The first dielectric layer 66 is comprised, for example, of silicon dioxide deposited to a thickness of between about 1,500 Angstroms and 15,000 Angstroms.

An etch stop layer 70 is deposited overlying the first dielectric layer 66. The etch stop layer 70 will act as an etch stop during the interconnect trench etch. The etch stop layer 70 is comprised, for example, of silicon nitride deposited to a thickness of between about 0 Angstroms and 1,500 Angstroms.

A second dielectric layer 74 is deposited overlying the etch stop layer 70. The purpose of the second dielectric layer 74 is to isolate between upper metal interconnects. The second dielectric layer 74 comprises, for example, silicon dioxide deposited to a thickness of between about 1,500 Angstroms and 15,000 Angstroms.

A first photoresist layer 78 is deposited overlying the second dielectric layer 74. The first photoresist layer 78 will be used to form the pattern for the via trenches to the underlying metal conductors 58. In this embodiment, the first photoresist layer 78 comprises a negative-type photoresist. The first photoresist layer 78 is deposited to a thickness of between about 3,000 Angstroms and 10,000 Angstroms.

Figure 6:
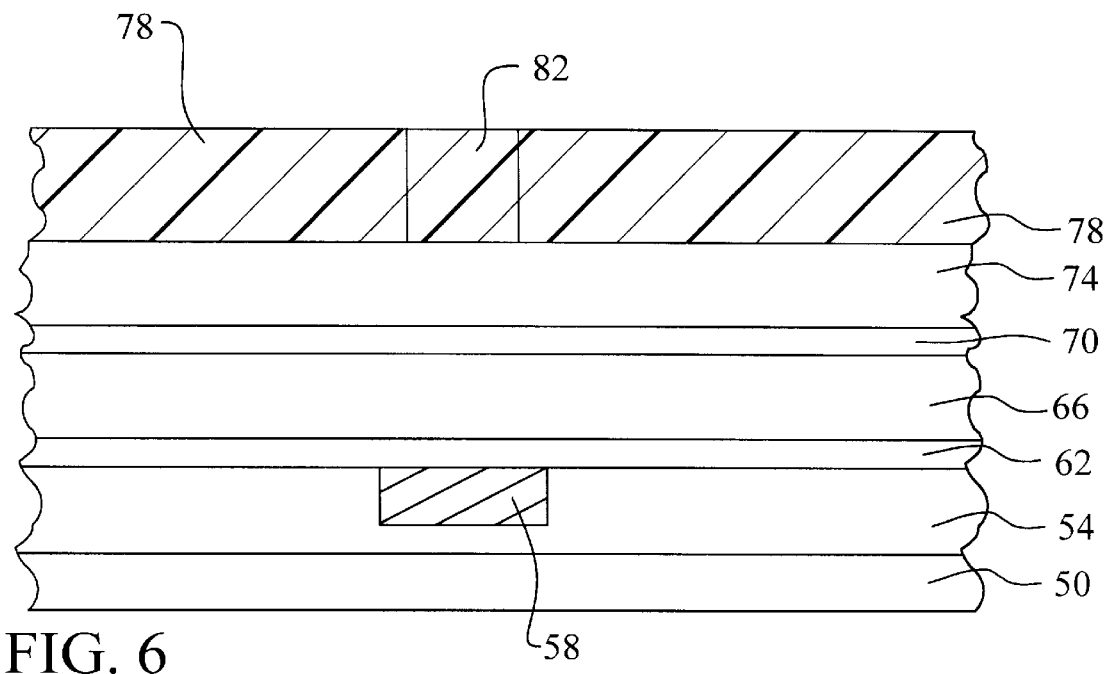

Referring now to FIG. 6, an important part of the present invention is shown. The first photoresist layer 78 is exposed, but not developed, to define patterns 82 where via trenches are planned. When the first photoresist layer 78 is later developed, the section 82 overlying the metal conductors 58 will be removed.

Figure 7:
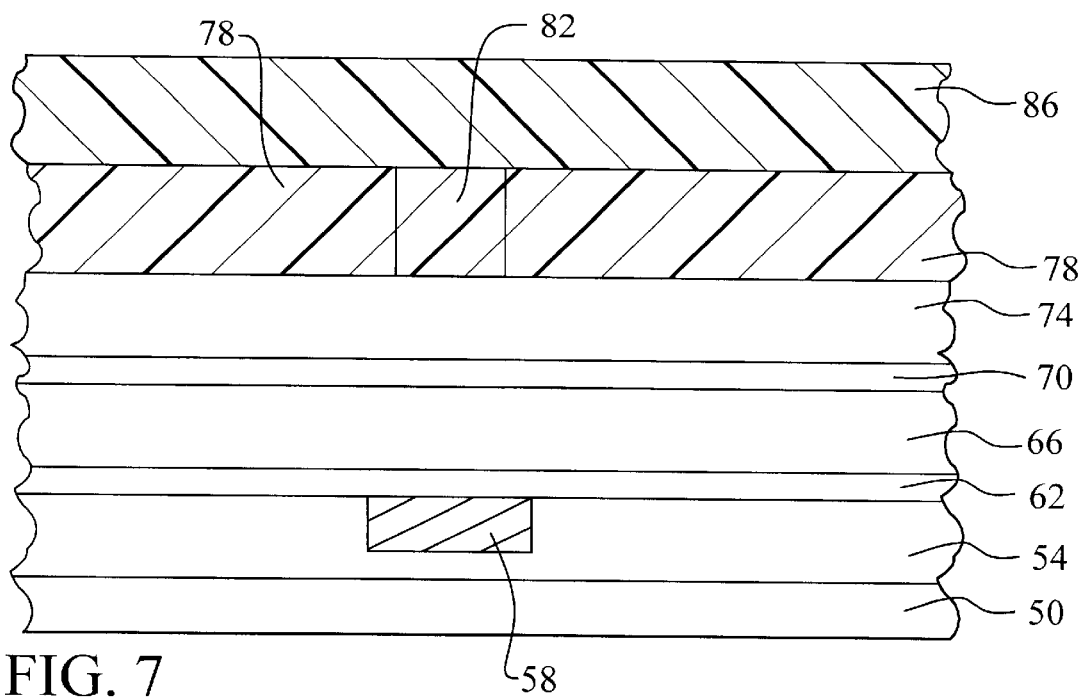

Referring now to FIG. 7, a second photoresist layer 86 is deposited overlying the first photoresist layer 78. The second photoresist layer 86 will be used to form the pattern for the upper metal interconnect trenches. In this embodiment, the second photoresist layer 86 comprises a negative-type photoresist. The second photoresist layer 86 is deposited to a thickness of between about 3,000 Angstroms and 10,000 Angstroms.

Figure 8:
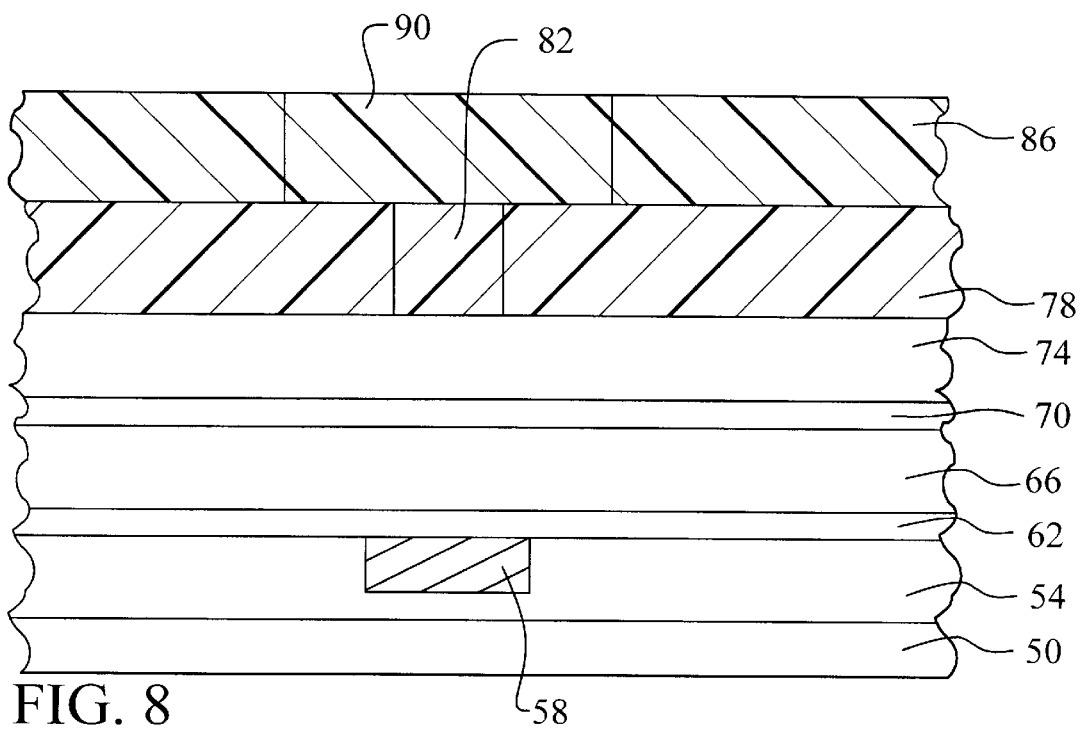

Referring now to FIG. 8, an important part of the present invention is shown. The second photoresist layer 86 is exposed to define patterns 90 where interconnect trenches are planned.

Figure 9:
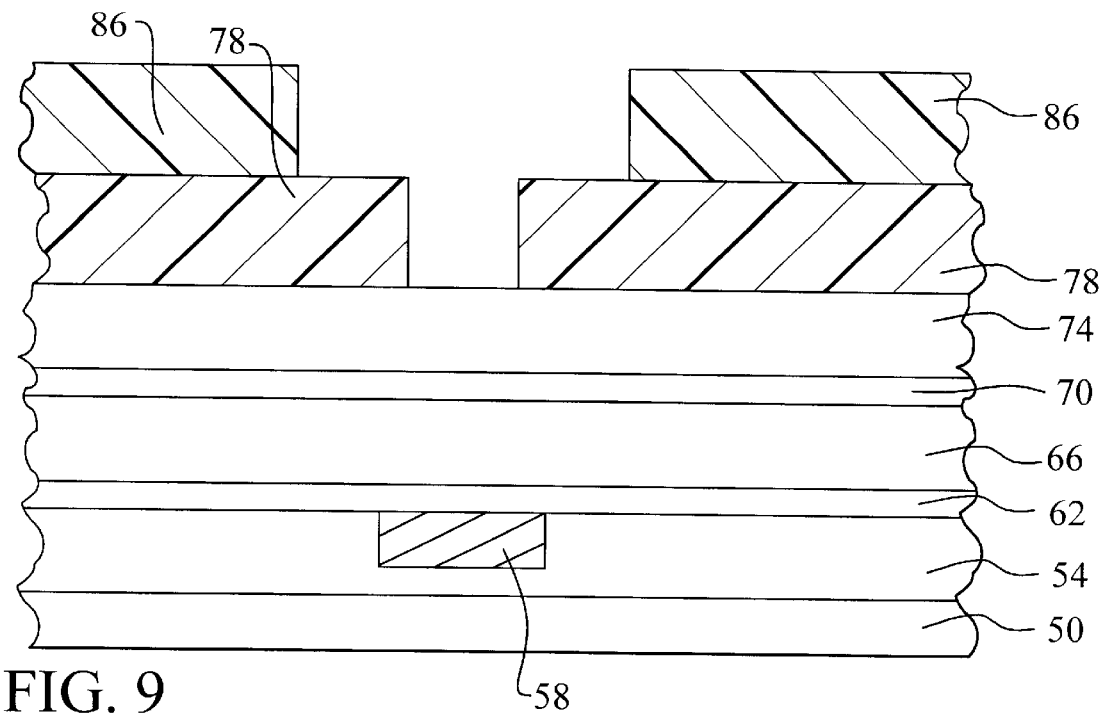

Referring now to FIG. 9, the second photoresist layer 86 and first photoresist layer 78 are developed to complete the via trench pattern of the first photoresist layer 78 and the interconnect trench pattern of the second photoresist layer 86. The exposed portions 90 and 82, respectively, are removed. Significant cost savings is realized by reducing the number of development steps from two to one.

Referring now to FIGS. 10 through 13, a process used to transfer the patterns of the first photoresist layer 78 and the second photoresist layer 86 is shown.

Figure 10:
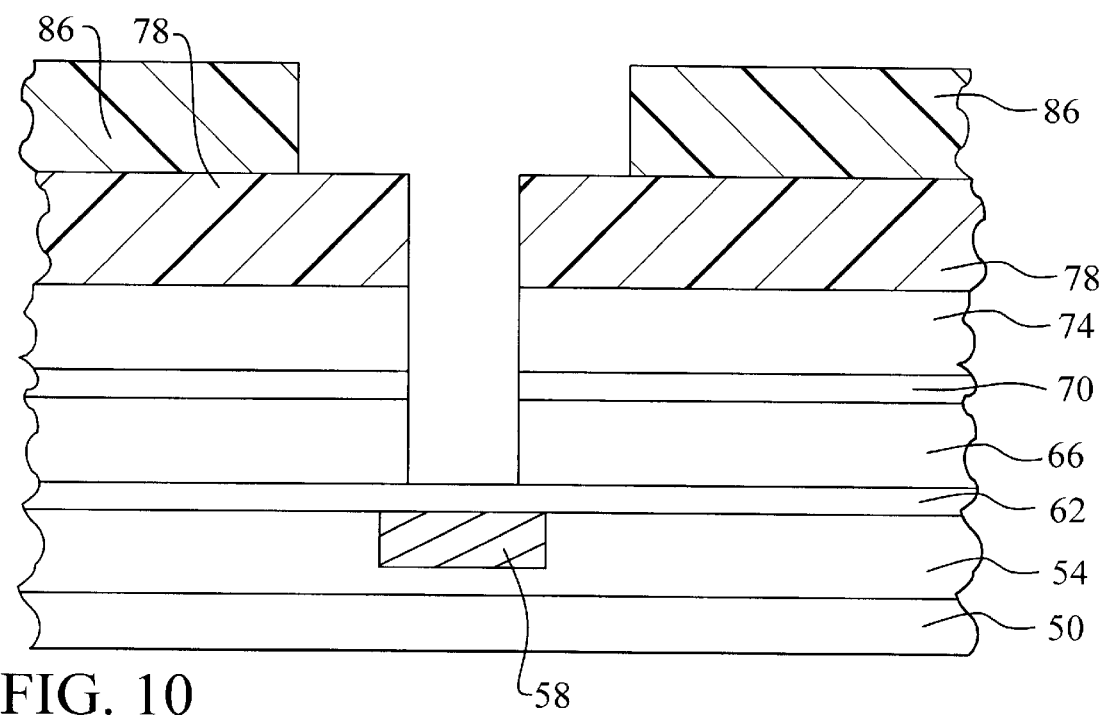
FIGS. 10 through 13 schematically illustrate a sequence to finish the dual damascene interconnects in any of the embodiments.

Referring to particularly to FIG. 10, an etching process sequence is begun. During the first part of the etching sequence, the second dielectric layer 74, the etch stop layer 70, and the first dielectric layer 66 are etched through to the cap layer 62 to create the via trenches. In the embodiment, this via trench etch is performed using a dry etch sequence with the first photoresist layer 78 as a mask.

Figure 11:
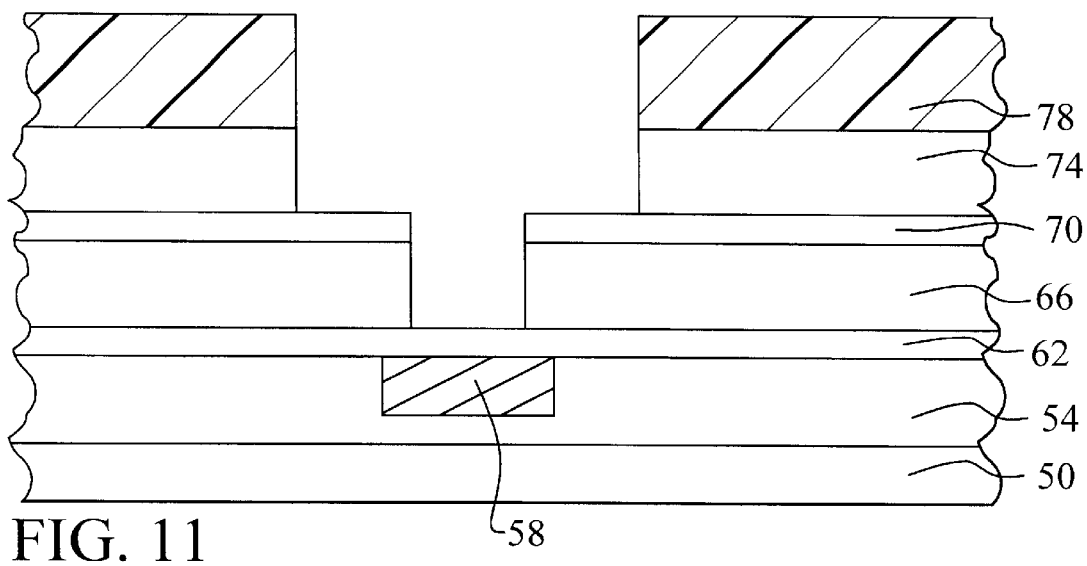

Referring now to FIG. 11, during the second part of the sequence, the first photoresist layer 78 is etched through as the second photoresist layer 86 is etched down such that the pattern of the second photoresist layer 86 is transferred to the first photoresist layer 78. The second dielectric layer 74 is etched through using the first photoresist layer 78 as a mask and stopping at the etch stop layer 70. This part of the etching sequence forms upper interconnect trenches.

Figure 12:
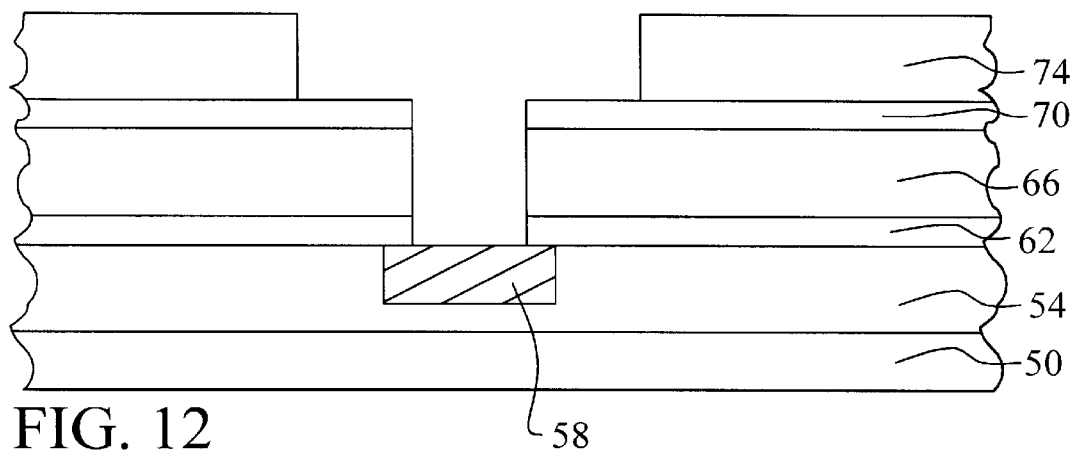

Referring now to FIG. 12, during the last part of the etching sequence, the cap layer 62 is etched through to expose the metal conductors 58.

Figure 13:
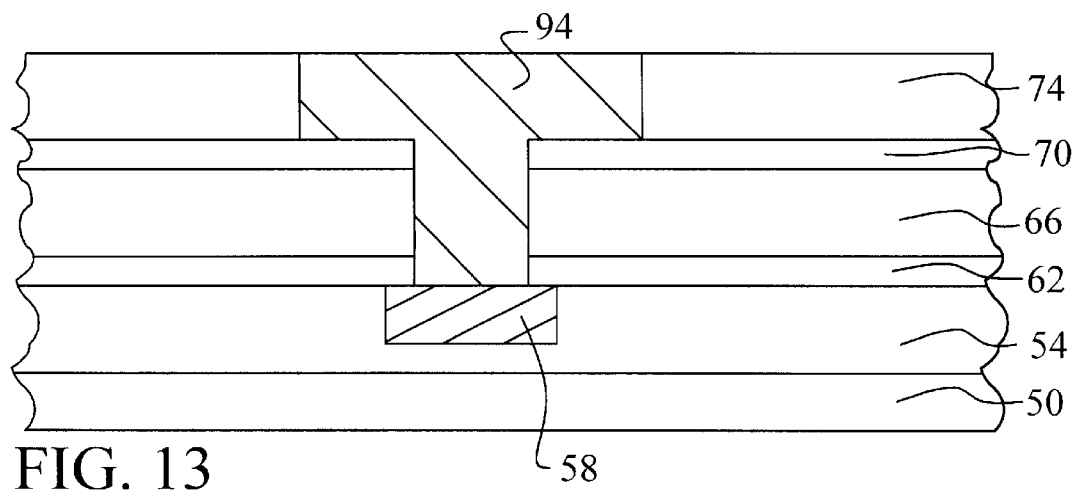

Referring now to FIG. 13, a metal layer 94 is deposited overlying the second dielectric layer 74. The metal layer 94 comprises, for example, copper deposited using either physical vapor deposition (PVD), electrochemical plating, or electroless plating. The metal layer is deposited to a thickness of between about 2,000 Angstroms and 12,000 Angstroms. The metal layer 94 is polished down by chemical mechanical polishing to remove the excess metal, and the dual damascene interconnect of the integrated circuit device is completed.

Figure 14:
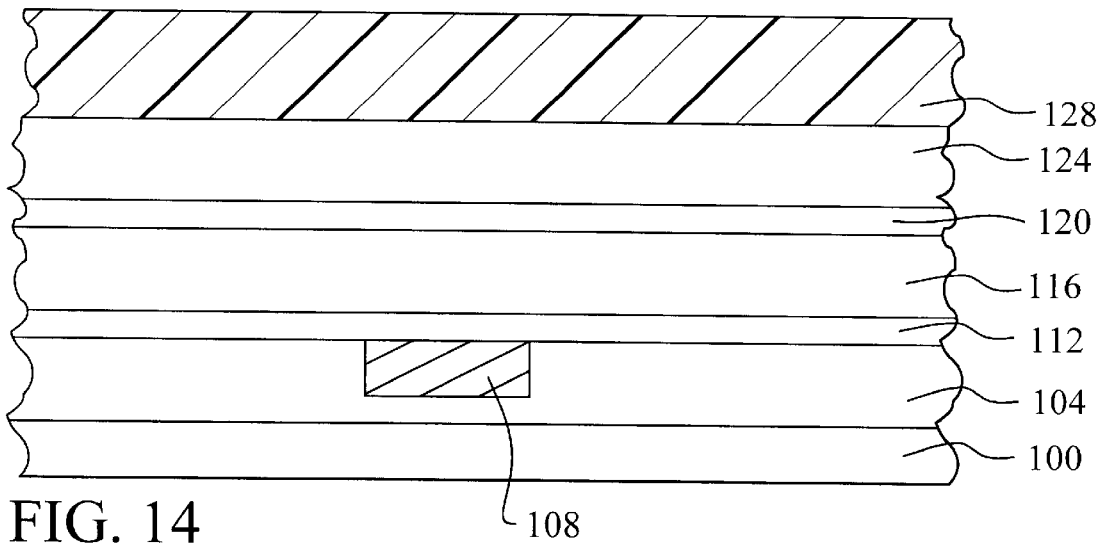
FIGS. 14 through 17 schematically illustrate in cross-sectional representation a second preferred embodiment of the present invention.

Referring now to FIG. 14, a second preferred embodiment of the present invention is shown. A semiconductor substrate 100, typically consisting of monocrystalline silicon, is provided. An insulating layer 104 is provided overlying the semiconductor substrate 100. The insulating layer 104 is typically composed of silicon dioxide. Metal conductors 108 are formed in the insulating layer 104 as is conventional in the art. A cap layer 112 is deposited overlying the insulating layer 104 and the metal conductors 108. For example, silicon nitride is deposited to a thickness of between about 150 Angstroms and 1,500 Angstroms.

A first dielectric layer 116 is deposited overlying the cap layer 112. The first dielectric layer 116 is comprised, for example, of silicon dioxide deposited to a thickness of between about 1,500 Angstroms and 15,000 Angstroms.

An etch stop layer 120 is deposited overlying the first dielectric layer 116. The etch stop layer 120 is comprised, for example, of silicon nitride deposited to a thickness of between about 0 Angstroms and 1,500 Angstroms. A second dielectric layer 124 is deposited overlying the etch stop layer 120. The second dielectric layer 124 comprises, for example, silicon dioxide deposited to a thickness of between about 1,500 Angstroms and 15,000 Angstroms. At this point, the steps are the same as in the first embodiment.

A first photoresist layer 128 is now deposited overlying the second dielectric layer 124. The first photoresist layer 128 will be used to form the pattern for the via trenches to the underlying metal conductors 108. In this embodiment, the first photoresist layer 128 comprises a negative-type photoresist. The first photoresist layer 128 is deposited to a thickness of between about 3,000 Angstroms and 10,000 Angstroms.

Figure 15:
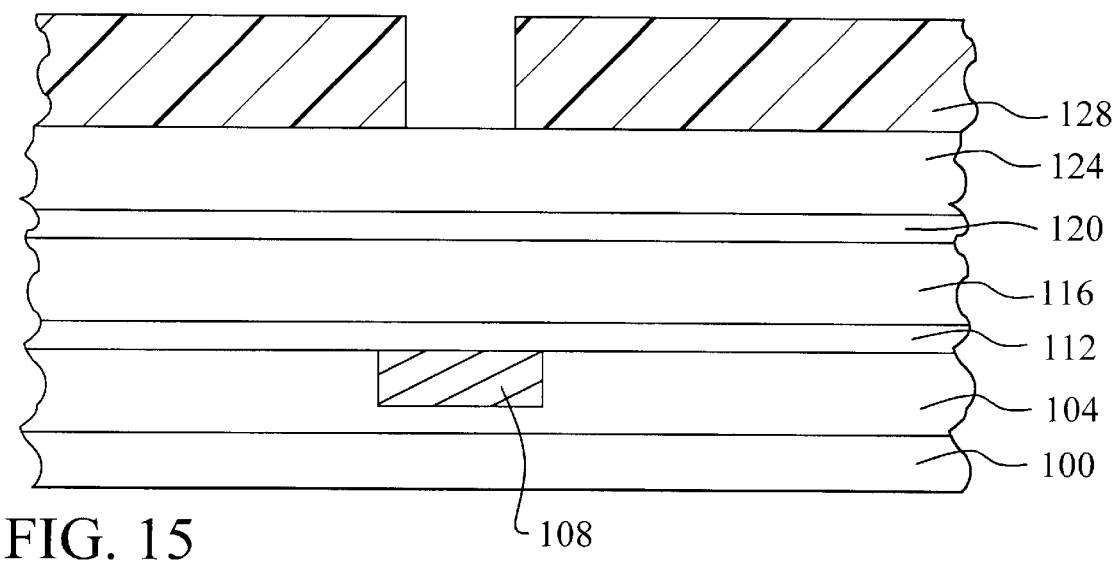

Referring now to FIG. 15, the first photoresist layer 128 is exposed and developed to define patterns where via trenches are planned. The openings in the first photoresist layer 128 overlie at least a part of the metal conductors 108.

Figure 16:
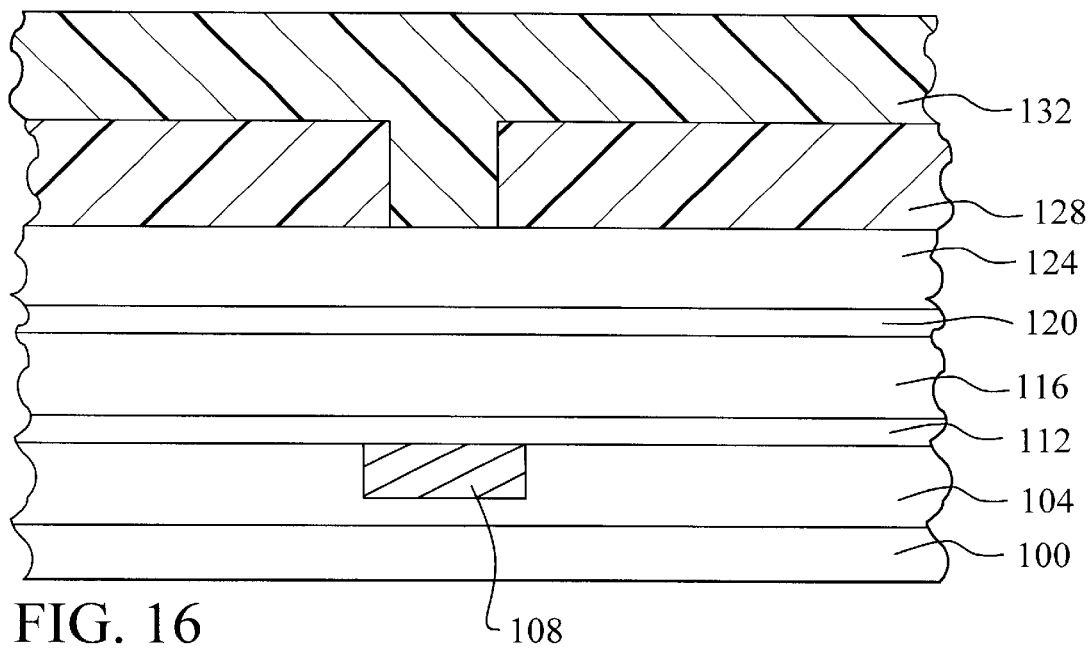

Referring now to FIG. 16, a second photoresist layer 132 is deposited overlying the first photoresist layer 128 and filling the openings in the via trench pattern. The second photoresist layer 132 will be used to form the pattern for the upper interconnect trenches. In this embodiment, the second photoresist layer 132 comprises a positive-type resist deposited to a thickness of between about 3,000 Angstroms and 10,000 Angstroms.

Figure 17:
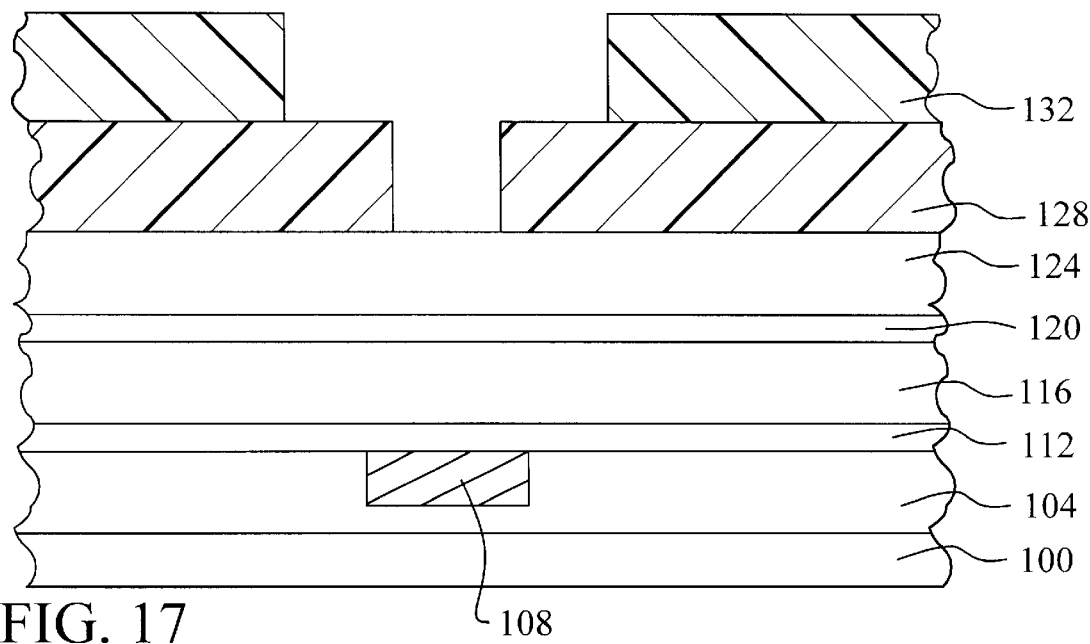

Referring now to FIG. 17, an important feature of the present invention is shown. The second photoresist layer 132 is exposed and developed to define patterns where interconnect trenches are planned. The patterned first photoresist layer 128 and second photoresist layer 132 are now ready for transfer into the dielectric layers as in the first embodiment. The process at this point may be completed as outlined above and illustrated in FIGS. 10 through 13 to fabricate the dual damascene interconnect structure. Note that the second embodiment has the advantage over the prior art of a single etching sequence used to transfer the photoresist patterns. Process time is saved by not having separate etching and resist strips for the via and interconnect trenches.

Figure 18:
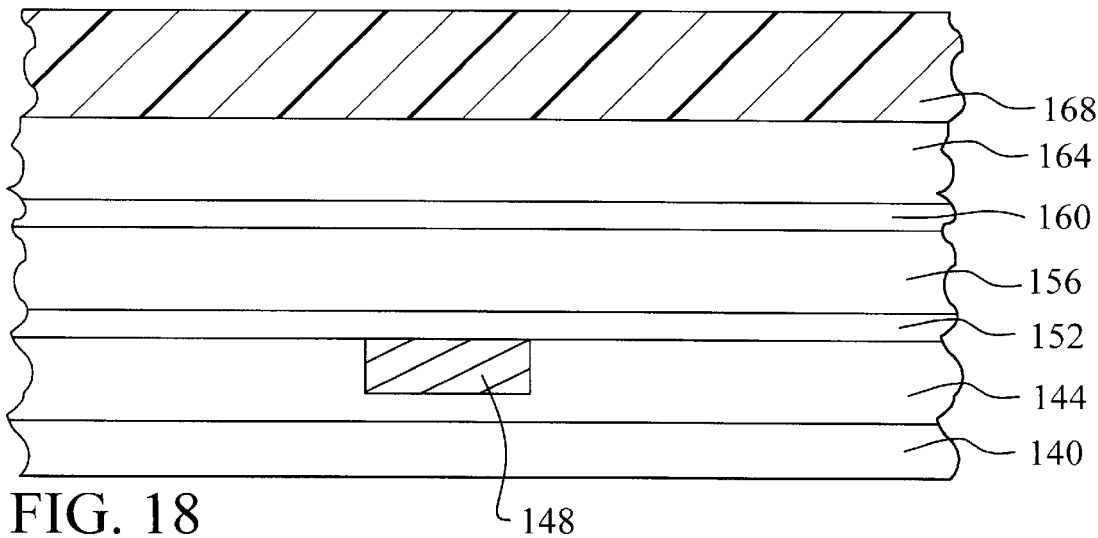
FIGS. 18 through 23 schematically illustrate in cross-sectional representation a third preferred embodiment of the present invention.

Referring now to FIG. 18, a third embodiment of the present invention is shown. A semiconductor substrate 140, typically consisting of monocrystalline silicon, is provided. An insulating layer 144 is provided overlying the semiconductor substrate 140. The insulating layer 144 is typically composed of silicon dioxide. Metal conductors 58 are formed in the insulating layer 144 as is conventional in the art. The metal conductors 148 comprise either aluminum or copper and may be formed using, for example, a damascene approach.

A cap layer 152 is deposited overlying the insulating layer 144 and the metal conductors 148. In this embodiment, the cap layer 152 comprises, for example, silicon nitride deposited to a thickness of between about 150 Angstroms and 1,500 Angstroms. A first dielectric layer 66 is deposited overlying the cap layer 152. The first dielectric layer 156 is comprised, for example, of silicon dioxide deposited to a thickness of between about 1,500 Angstroms and 15,000 Angstroms.

An etch stop layer 160 is deposited overlying the first dielectric layer 156. The etch stop layer 160 is comprised, for example, of silicon nitride deposited to a thickness of between about 0 Angstroms and 1,500 Angstroms. A second dielectric layer 164 is deposited overlying the etch stop layer 160. The second dielectric layer 164 comprises, for example, silicon dioxide deposited to a thickness of between about 1,500 Angstroms and 15,000 Angstroms. These steps are the same as those of the first embodiment.

A first photoresist layer 168 is now deposited overlying the second dielectric layer 164. The first photoresist layer 168 will be used to form the pattern for the via trenches to the underlying metal conductors 148. In this embodiment, the first photoresist layer 168 comprises a positive-type photoresist. The first photoresist layer 168 is deposited to a thickness of between about 3,000 Angstroms and 10,000 Angstroms.

Figure 19:
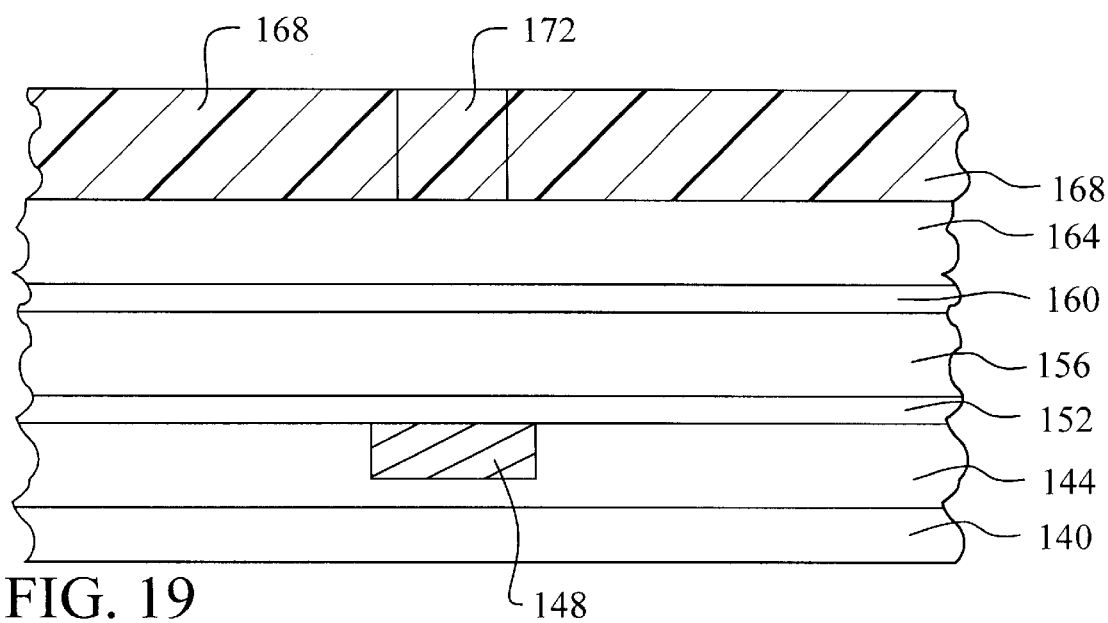

Referring now to FIG. 19, an important part of the present invention is shown. The first photoresist layer 168 is exposed, but not developed, to define patterns 172 where via trenches are planned. When the first photoresist layer 168 is later developed, the section 172 overlying the metal conductors 148 will be removed.

Figure 20:
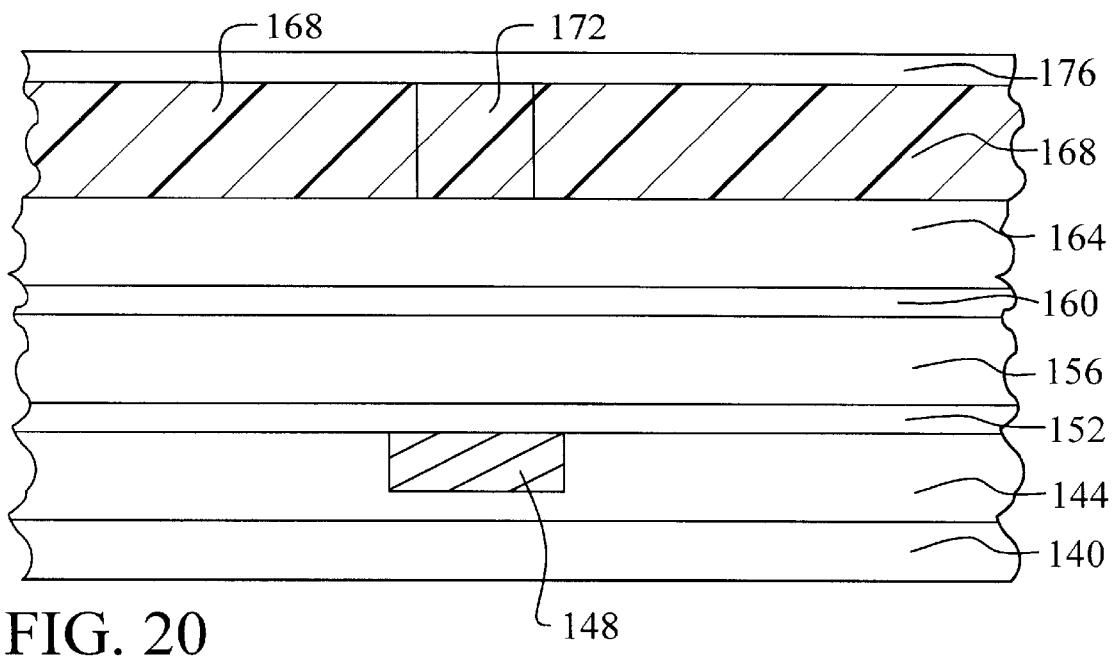

Referring to FIG. 20, an important part of the present invention is shown. A buffer layer 176 is deposited overlying the first photoresist layer 168. The buffer layer 176 may be comprised of, though is not limited to, solvent developable photosensitive polyimide, also called Langmuir-Blodgett (LB) films, of the dye surfactants, such as cyanine and squaraine. The buffer layer 176 can be any film that is highly absorbent or opaque to the exposure light wavelength and that can be developed along with the photoresist material. The buffer layer 176 must be comprised of a material that is either highly light absorbent or highly light reflective. This buffer layer 176 protects the underlying first photoresist layer 168 from double exposure during the subsequent exposure of the second photoresist layer. The buffer layer 176 material must also be removed using a conventional wet developing process. The buffer layer 176 is deposited to a thickness of between about 200 Angstroms and 2,000 Angstroms.

Figure 21:
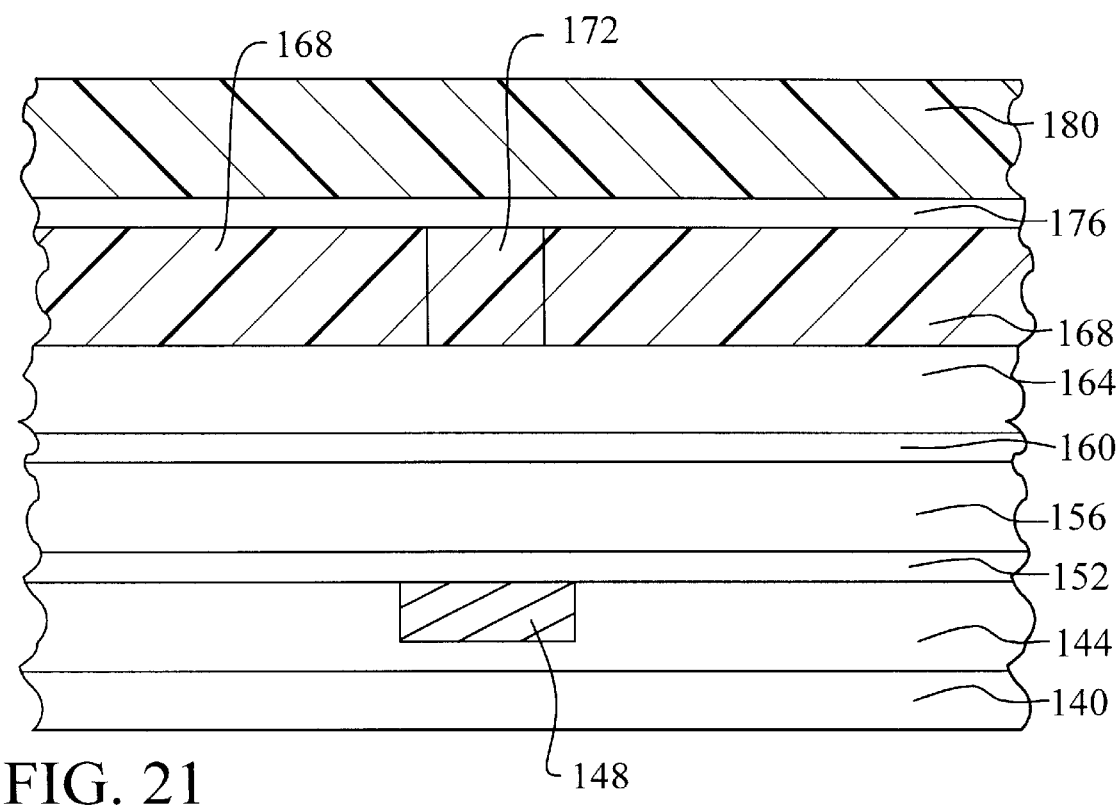

Referring now to FIG. 21, a second photoresist layer 180 is deposited overlying the buffer layer 176. The second photoresist layer 180 is preferably comprised of a positive-type resist. The second photoresist layer 180 is deposited to a thickness of between about 3,000 Angstroms and 10,000 Angstroms.

Figure 22:
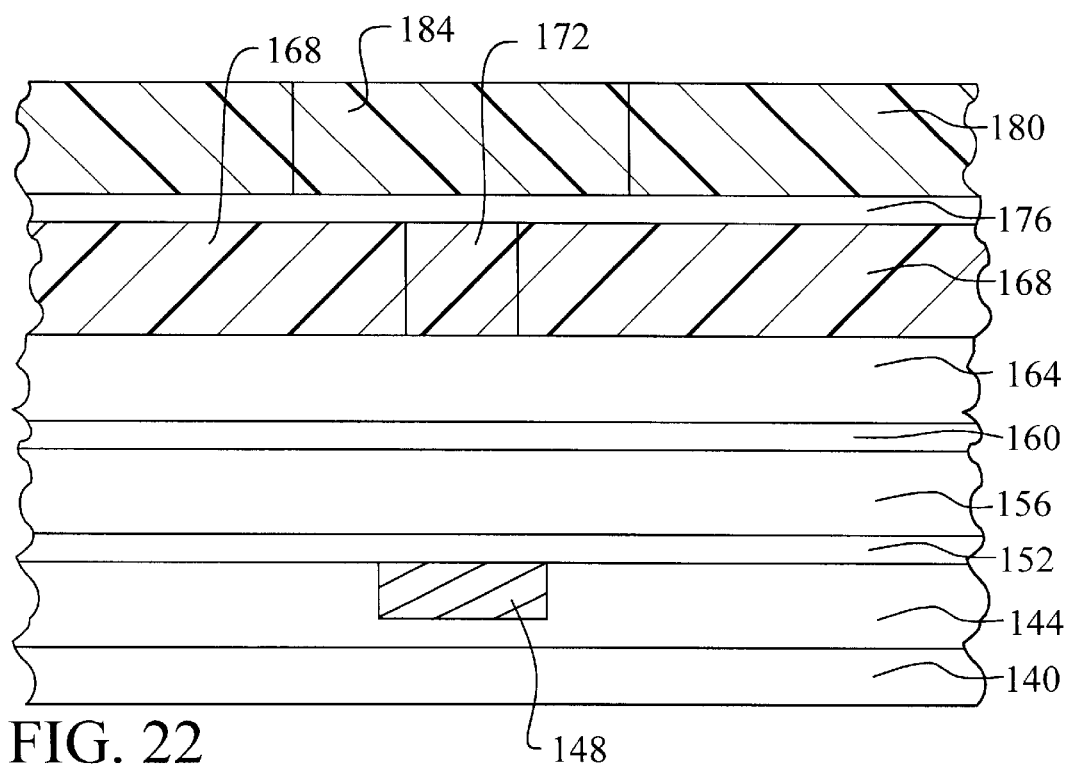

Referring now to FIG. 22, an important feature of the third embodiment of the present invention is shown. The second photoresist layer 180 is exposed to define patterns 184 where upper interconnect trenches are planned.

Figure 23:
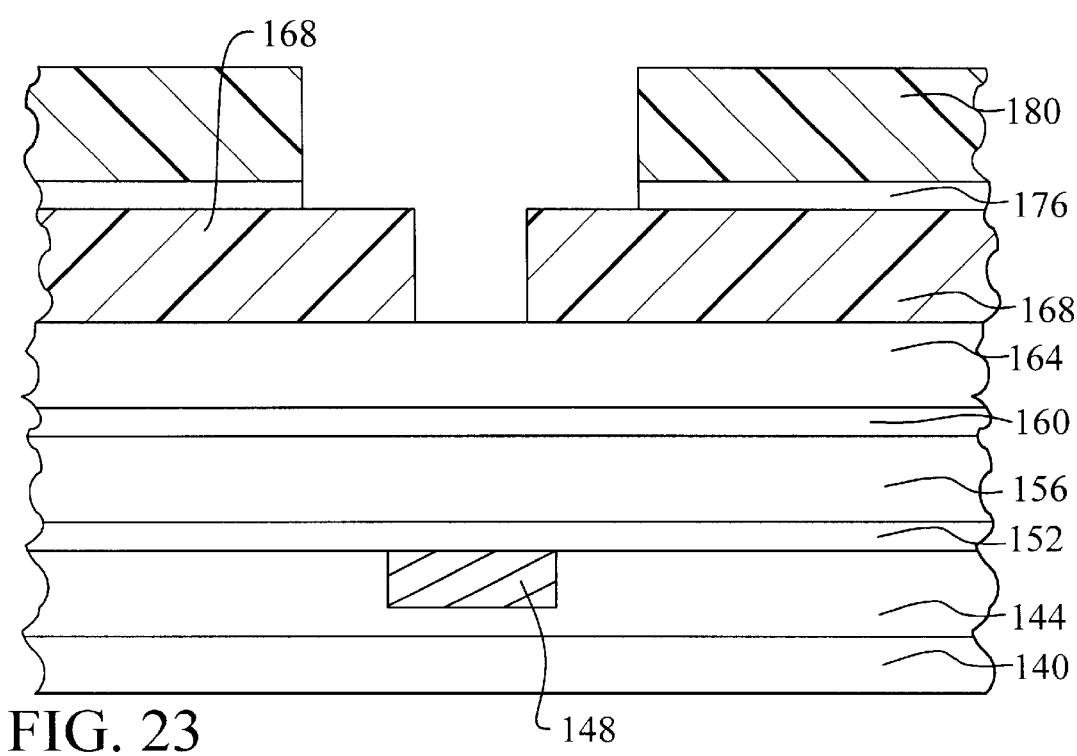

Referring now to FIG. 23, the second photoresist layer 180 and the first photoresist layer 168 are developed and the buffer layer 176 is stripped to complete the via trench pattern of the first photoresist layer 168 and the interconnect trench pattern of the second photoresist layer 180 and the buffer layer 176. The patterned first photoresist layer 168 and second photoresist layer 180 are now ready for transfer into the dielectric layers as in the first embodiment. The process at this point may be completed as outlined above and illustrated in FIGS. 10 through 13 to fabricate the dual damascene interconnect structure. The third embodiment has the advantages of requiring only one develop step and the single etching sequence that was outlined in the first embodiment.

The advantages of the present invention over the prior art are as follows. First, in the first and third embodiments, one of the two developing steps is eliminated. Second, in each of the embodiments, process time is likewise saved by using a single etching sequence to transfer the photoresist patterns into the dielectric layers.

As shown in the preferred embodiments, the present invention provides a very manufacturable process for fabricating dual damascene interconnects in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to fabricate dual damascene trenches in the manufacture of an integrated circuit device comprising:

providing a semiconductor substrate;

providing a dielectric layer overlying said semiconductor substrate;

depositing a first photoresist layer overlying said dielectric layer;

exposing said first photoresist layer to define via trench patterns wherein said photoresist layer is not yet developed;

depositing a second photoresist layer overlying said first photoresist layer;

exposing said second photoresist layer to define interconnect trench patterns;

developing said second photoresist layer and said first photoresist layer simultaneously to complete said via trench patterns in said first photoresist layer and said interconnect trench patterns in said second photoresist layer;

etching through said dielectric layer where defined by said via trench patterns in said first photoresist layer to form said via trenches and where defined by said interconnect trench patterns in said second photoresist layer to form interconnect trenches;

depositing a metal layer overlying said dielectric layer and filling said via trenches and said interconnect trenches; and polishing down said metal layer to the top surface of said dielectric layer to complete said dual damascene trenches in the manufacture of the integrated circuit device.

2. The method according to claim 1 wherein said first photoresist layer comprises a negative-type photoresist.

3. The method according to claim 1 wherein said second photoresist layer comprises a negative-type photoresist.

4. The method according to claim 1 wherein said first photoresist layer is deposited to a thickness of between about 3,000 Angstroms and 10,000 Angstroms.

5. The method according to claim 1 wherein said second photoresist layer is deposited to a thickness of between about 3,000 Angstroms and 10,000 Angstroms.

6. The method according to claim 1 further comprising:

depositing a buffer layer overlying said first photoresist layer after said step of exposing said first photoresist layer; and stripping away said buffer layer during said step of developing said second photoresist layer and said first photoresist layer.

7. A method to fabricate dual damascene trenches in the manufacture of an integrated circuit device comprising:

providing a semiconductor substrate;

providing a dielectric layer overlying said semiconductor substrate;

depositing a first photoresist layer overlying said dielectric layer;

patterning said first photoresist layer to define via trench patterns;

depositing a second photoresist layer overlying said first photoresist layer;

patterning said second photoresist layer to define interconnect trench patterns wherein said via trench patterns are narrower than said interconnect patterns and are fully underlying said interconnect trench patterns;

etching through said dielectric layer where defined by said via trench patterns in said first photoresist layer to form said via trenches and where defined by said interconnect trench patterns in said second photoresist layer to form said interconnect trenches wherein each of said dual damascene trenches comprises one of said interconnect trenches and one of said via trenches underlying said one of said interconnect trenches;

depositing a metal layer overlying said dielectric layer and filling said via trenches and said interconnect trenches; and polishing down said metal layer to the top surface of said dielectric layer to complete said dual damascene trenches in the manufacture of an integrated circuit device.

8. The method according to claim 7 wherein said first photoresist layer comprises a negative-type photoresist.

9. The method according to claim 7 wherein said second photoresist layer comprises a positive-type photoresist.

10. The method according to claim 7 wherein said first photoresist layer is deposited to a thickness of between about 3,000 Angstroms and 10,000 Angstroms.

11. The method according to claim 7 wherein said second photoresist layer is deposited to a thickness of between about 3,000 Angstroms and 10,000 Angstroms.

12. A method to fabricate dual damascene trenches in the manufacture of an integrated circuit device comprising:

providing a semiconductor substrate;

providing a dielectric layer overlying said semiconductor substrate;

depositing a first photoresist layer overlying said dielectric layer;

exposing said first photoresist layer to define via trench patterns where said first photoresist layer is not yet developed;

depositing a buffer layer overlying said first photoresist layer;

depositing a second photoresist layer overlying said buffer layer;

exposing said second photoresist layer to define interconnect trench patterns where said second photoresist layer is not yet developed;

developing said second photoresist layer and said; first photoresist layer and stripping away said buffer layer to complete said via trench patterns in said first photoresist layer and said interconnect trench patterns in said second photoresist layer and said buffer layer; and etching through said dielectric layer where defined by said via trench patterns in said first photoresist layer to form said via trenches and where defined by said interconnect trench patterns in said second photoresist layer and said buffer layer to form said interconnect trenches to complete said dual damascene trenches in the manufacture of the integrated circuit device.

13. The method according to claim 12 wherein said first photoresist layer comprises a positive-type photoresist.

14. The method according to claim 12 wherein said second photoresist layer comprises a positive-type photoresist.

15. The method according to claim 12 wherein said first photoresist layer is deposited to a thickness of between about 3,000 Angstroms and 10,000 Angstroms.

16. The method according to claim 12 wherein said second photoresist layer is deposited to a thickness of between about 3,000 Angstroms and 10,000 Angstroms.

17. The method according to claim 12 further comprising:

depositing a metal layer overlying said dielectric layer and filling said via trenches and said interconnect trenches after said step of etching said dielectric layer to form said interconnect trenches; and polishing down said metal layer to the top surface of said dielectric layer.

18. The method according to claim 12 wherein said buffer layer comprises one of the group of: solvent developable photosensitive polyimide films (LB films) of the dye surfactant cyanine and solvent developable photosensitive polyimide films (LB films) of the dye surfactant squaraine.

* * * * *

UNITED STATES PATENT AND TRADEMARK OFFICE
CERTIFICATE OF CORRECTION

PATENT NO.    : 6,465,157 B1                                          Page 1 of 1
DATED         : October 15, 2002
INVENTOR(S)   : Jianxun Li et al.

It is certified that error appears in the above-identified patent and that said Letters Patent is hereby corrected as shown below:

<u>Title page,</u>
Item [75], delete "Ming hui Far", and replace with -- Ming Hui Fan --.

Signed and Sealed this

Fifteenth Day of April, 2003

JAMES E. ROGAN
*Director of the United States Patent and Trademark Office*